United States Patent [19]

Waldo, III et al.

[11] Patent Number: 5,552,247

[45] Date of Patent: Sep. 3, 1996

[54] METHOD FOR PATTERNING AN X-RAY MASTER MASK

[75] Inventors: Whitson G. Waldo, III, Poughkeepsie; Matthew A. Thompson, Fishkill, both of N.Y.

[73] Assignee: Motorola, Schaumburg, Ill.

[21] Appl. No.: 678,098

[22] Filed: Apr. 1, 1991

[51] Int. Cl.[6] ........................................................ G03F 9/00
[52] U.S. Cl. .................................. 430/5; 430/22; 430/313; 430/323; 430/396
[58] Field of Search .................................... 430/5, 22, 313, 430/323, 396

[56] References Cited

U.S. PATENT DOCUMENTS 4,855,197  8/1989  Zapka ............................... 430/323

*Primary Examiner*—S. Rosasco
*Attorney, Agent, or Firm*—Gary F. Witting

[57] ABSTRACT

A method of patterning an X-ray master mask (21) is described by using reduction projection. An X-ray mask (21) is provided with a photoactive material coating a plating base layer (24). The X-ray mask (21) is positioned under the reduction projection tool. The photoactive material on the X-ray mask (21) is exposed from a pattern (13) in the reduction projection tool.

7 Claims, 2 Drawing Sheets

METHOD FOR PATTERNING AN X-RAY MASTER MASK

BACKGROUND OF THE INVENTION

This invention relates, in general, to manufacturing of semiconductor products, and more particularly, to fabricating masks for lithography.

At present, optical reduction printing of microcircuit patterns dominates the integrated circuit industry. Generally, these microcircuit patterns are originally formed on a photoresist coated glass plate called a master mask or a reticle. An electron beam which is focused into a small spot is scanned over the photoresist covered glass plate, thereby exposing the photoresist on the glass plate and creating a pattern. The glass plate is photographically developed, etched, and used as the master mask to optically transfer the pattern on the master mask to a semiconductor wafer. The transfer of the pattern from the glass plate or the master mask to the semiconductor wafer is achieved typically by a reduction projection tool and ordinary photolithographic techniques. Generally, reduction projection tools reduce the patterns or features on the master mask by 4×, 5×, or 10× at the surface of the semiconductor wafer.

Resolution of photolithographic techniques is limited by frequency or wavelength of radiation that is used to project the features in the reduction projection tool. Even though optical reduction projection of very small features sizes, such as 0.25 microns or 2,500 angstroms, is achievable, it is a very difficult process to control in a high volume production environment. X-rays, however, are capable of resolving very small features because of their higher frequency or shorter wave length. By using higher frequency or shorter wavelength radiation, such as X-rays, to project small features, control of the lithographic process is greatly simplified.

However, X-ray mask making is a difficult process. X-ray mask making is, generally, achieved by using an electron beam that is focused into an extremely small spot size of approximately 200 or 300 angstroms. An X-ray master mask blank is built from a composite of materials, which is further prepared by coating a surface that is to be photographically exposed with a photoactive material or a photoresist material. The photoresist coated X-ray master mask blank is placed onto a movable precision stage. The stage is then positioned and stopped for the electron beam to expose this one area. The stage is then moved to another area for another exposure. This process is repeated many times until the entire pattern is exposed; however, this process introduces many kinds of errors into the X-ray master mask, such as line width, feature placement, and the like. These errors are then replicated on the semiconductor wafer when the X-ray mask is used to project the pattern onto the semiconductor wafer. Production of X-ray masks by the conventional process is very slow and, therefore time consuming and costly.

Additionally, X-ray master masks deteriorate in time when used in an X-ray projection system. Because the deteriorated masks eventually have to be thrown away, not only causes the cost of operating an X-ray lithography system to increase, but also increases the need for reliable replication of duplicate X-ray masks.

It can be seen that the conventional process of fabricating X-ray master masks is not adequate. The conventional approach causes many kinds of errors and is expensive. Therefore, a method that would substantially improve quality of replication, simplify the process, and reduce the cost is highly desirable.

SUMMARY OF THE INVENTION

The objects and advantages of the present invention are provided by a method for patterning an X-ray master mask blank by exposing a pattern with a reduction projection tool. The X-ray master mask blank is provided with a photoactive material applied to a surface that is to be exposed. The X-ray master mask blank with the photoactive material is positioned so that exposure is accomplished by the reduction projection tool.

DETAILED DESCRIPTION OF THE DRAWINGS

Figure 1:
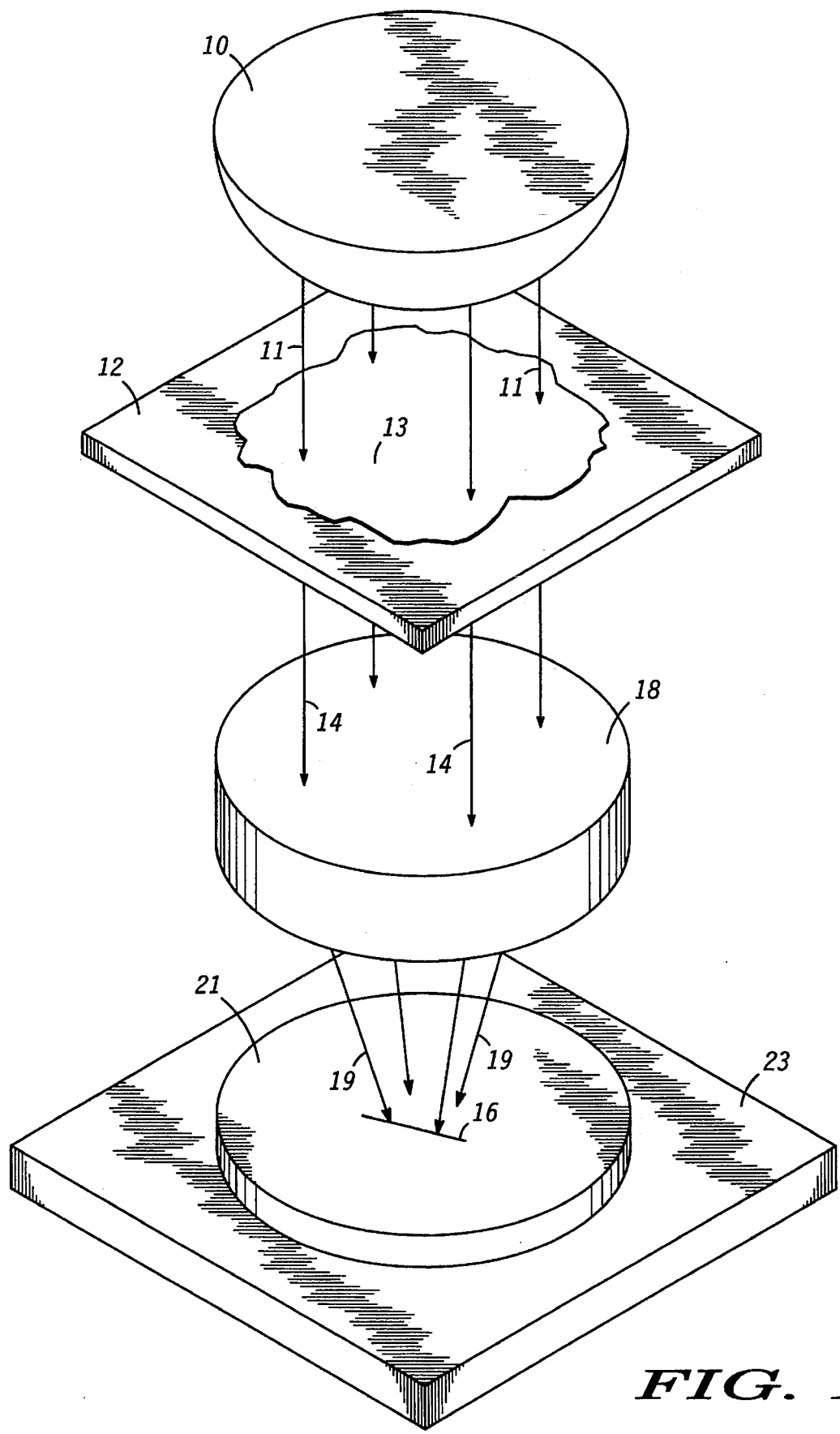
FIG. 1 is a simplified pictorial illustration of a reduction projection tool imaging on an X-ray master mask blank.

FIG. 1 is a simplified pictorial illustration of a reduction projection tool exposing an image on an X-ray master mask blank 21. Reduction projection tools are commonly optical, using a variety of illumination sources, such as arc lamps, LASERs, or X-rays. Additionally, advanced lithographic reduction techniques, such as multilayer lithography, surface sensitive imaging, electron reduction lithography, or phase shift masking can be used in conjunction with the variety of illumination sources. Typically, radiation source 10 is a visible light source that is generated by a mercury arc lamp. However, other sources are common and are capable of being used, such as an electron beam source, an ultraviolet source, or an X-ray source. Frequency or wavelength of radiation 11 is determined by radiation source 10. It should be understood that by selecting different illumination sources it is also possible to select different portions of an electromagnetic spectrum to illuminate reticle 12. Radiation 11 that comes from radiation source 10 is uniform and is evenly distributed across reticle, mask, or stencil 12. The uniform radiation coming from radiation source 10 is shown by arrows 11.

Radiation 11 strikes stencil or reticle 12. Reticle 12 generally is made of a quartz plate or a glass plate. Pattern 13 on reticle 12 is defined by a radiation absorber, such as chrome or gold. Typically, pattern 13 is a mixture of geometric features that are used to define a semiconductor device. However, other types of reticles are used depending upon radiation source 10. By way of example, when radiation source 10 is an X-ray source, a specialized reticle is used, sometimes called a stencil.

By having radiation 11 strike pattern 13 on reticle 12, a duplicate of pattern 13 is formed. High intensity areas are formed by having radiation 11 pass through reticle 12 with very little absorption, while low or zero intensity areas are formed by having pattern 13 block or absorb radiation 11. Arrows 14 represent the radiation pattern that is generated by passing through pattern 13 on reticle 12. Radiation 14 is collected by reduction lens 18.

Reduction lens 18, typically, is an optical lens, but other suitable lens systems can also be applied, such as a Schwartzchild lens system, a reduction mirror system or an electron lens system. Reduction lens 18 serves to reduce the pattern that is projected onto upper surface of reduction lens 18. Generally, reduction lens 18 reduces the pattern by 4×, 5×, or 10×. By way of example, using reduction lens 18 with a 10× reduction factor, reduces a line width of 5.0 microns in pattern 13 on reticle 12 to a line width of 0.5 micron at focal point 16.

Radiation 19 that exits reduction lens 18 is directed to focal point 16. Focal point 16 is a precise distance from the reduction lens 18 where pattern 13 is replicated in a clearly defined and reduced form. X-ray mask 21 is positioned precisely at focal point 16, so that an exposure of the reduced pattern is faithfully reproduced on X-ray mask 21. X-ray mask 21 is positioned at focal point 16 by precision stage 23.

Conventionally in the prior art, X-ray master mask blank was exposed by an electron beam that was focused into a small spot. The size of the electron beam spot for high resolution was usually on an order of 0.02 to 0.03 micron, whereas a larger spot size was used for low resolution. The X-ray master mask blank, which was coated with photoresist, was mounted on a movable stage. The stage was positioned and stopped, so that the electron beam exposes one area. The stage was then commanded to move to another position, to stop, and to make another exposure. This process was repeated until the entire pattern was exposed.

By exposing the X-ray master mask blank with conventional electron beam techniques, pattern placement and line width errors were induced into the X-ray mask. Generally, these errors were divided in two broad interrelated categories: errors caused by electron beam optics and errors caused by stage positioning. Errors caused by the electron beam optics were associated with forming and positioning the electron beam itself in an electron beam tool, whereas stage errors are associated with imprecise movement of the stage that holds the X-ray master mask blank. When these two categories were measured together, pattern placement errors ranged typically between 0.05 to 0.12 micron each time the stage moved. These errors were of great significance to exposing small line widths or features sizes, such as 0.5 micron, or less. By way of example, using a line width of 0.5 micron would be reduced to 0.38 micron line width or increased to 0.62 micron line width by errors generally attributed to the electron beam tool, therefore producing a 48 percent error in line width or feature size. Other error types that are also related to the electron beam tool and the stage imprecision were electron dose variation which was further complicated by development variations and field butting errors that were caused by stage imprecision.

Additionally, other problems occur when conventional electron beam technology was used for making X-ray master masks, such as proximity effects and cost. Proximity effects are very complex problems that are associated with electron beam technology. Proximity problems are more evident as feature size or line width is reduced.

Cost of fabricating an X-ray master mask by conventional electron beam technology was extremely high because of the large amount of time it took to expose a pattern with the electron beam tool. It should be understood that these problems get more serious as smaller features are defined. It should be further understood that these positional errors can occur every time the precision stage is moved and the electron beam is used.

In the present invention, however, these randomly occurring placement errors and critical dimensional control problems are either avoided or abated by using reduction projection techniques to expose X-ray master mask blank 21, because reduction lithography reduces the errors and problems in pattern 13 on reticle 12 by a reduction factor of reduction lens 18. Fabricating pattern 13 on reticle 12 is achieved with conventional electron beam technology. This electron beam technology is similar to the conventional method used to fabricate X-ray master masks discussed previously and yields the same total error amounts in pattern 13. However, instead of making very small features or line widths, relatively large features or line widths are made in pattern 13 on reticle 12. By way of example, line width in pattern 13 on reticle 12 is determined by line width required at focal point 16 and the reduction factor of lens 18. Therefore, achieving a line width of 0.5 micron at focal point 16 with lens 18 having a reduction factor of 10× requires a line width of 5.0 microns in pattern 13 on reticle 12. This line width is easily achieved with conventional electron beam technology.

Errors caused by the electron beam tool and associated processing result in line width errors and feature size errors that are the same range as previously discussed. However, by making relatively large features or line widths in pattern 13, percent error is reduced. By way of example, using 5.0 microns line width in pattern 13 the combined total positioning error of the electron beam optics and the stage range typically between 0.05 to 0.12 micron. Using the larger value of error, a 5.0 microns line width could be reduced to 4.88 microns line width or increased to 5.12 microns line width. These combined worst-case errors result in a 4.8 percent total range of variation in line width; therefore, producing a 10 fold improvement in worse-case total positioning error over the conventional electron beam techniques. Additionally, by using a reduction projection technique to expose X-ray master mask blank 21, these randomly occurring errors are further reduced at focal point 16 by a factor of reduction in lens 18. By comparing the total range of variation of the conventional electron beam technique to the total range of variation of the present invention a large improvement is obtained in the total of line width of variation. Therefore, reduction projection results in a higher quality, a more consistently placed, and a more controlled line width or feature size. Additionally, proximity effects are also reduced because of the larger features that are generated in pattern 13 on reticle 12.

Furthermore, pattern placement variation due to randomly occurring errors, Such as stage imprecision, at focal point 16 is reduced since pattern placement is also susceptible to the same errors and problems as control of features sizes or control of line widths. Electron beam placement errors from the electron beam optics and the stage position, result in the same total positional error amount and range on reticle 12.

By fabricating X-ray master mask 21 with the present invention, process simplification occurs by using a well understood and a well characterized reduction projection tool. It should be understood that conventional electron beam tools built for exposing X-ray master masks are extremely sensitive and complicated pieces of equipment.

Additionally, cost of fabricating X-ray master mask 21 is reduced for at least two reasons. First by exposing X-ray master mask 21 with the present invention only a small fraction of time is required, compared to an extremely long exposure time required for conventional electron beam techniques for multiple copies of X-ray master mask 21. Second, duplicate X-ray master masks can be generated sequentially, so that identical X-ray master masks 21 are available to replace deteriorated masks.

Figure 2:
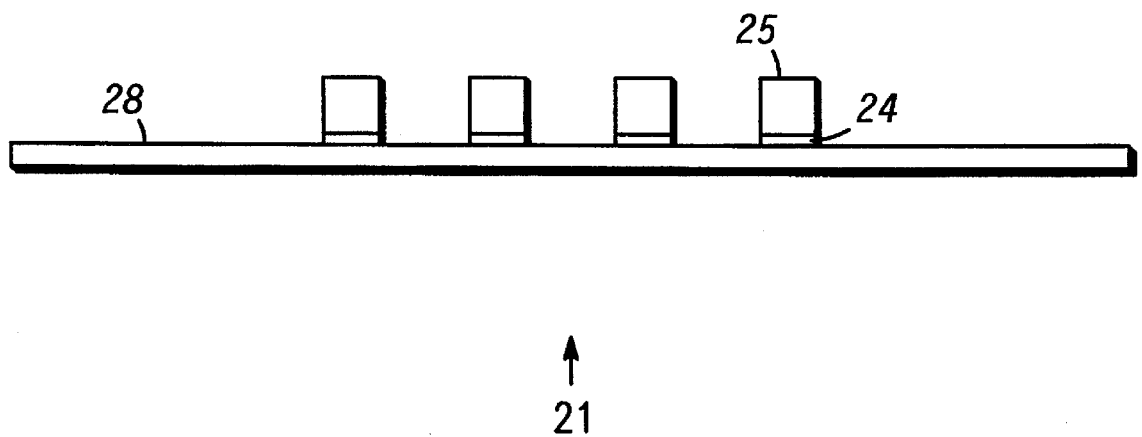
FIG. 2 is an enlarged cross-section of an X-ray master mask.

FIG. 2 is an enlarged simplified cross-section of a portion of an X-ray master mask 21. By way of example only, one typical type of X-ray master mask structure is disclosed in U.S. Pat. No. 4,632,871, which was issued to Karnezos et al.

on Dec. 30, 1986 and is hereby incorporated herein by reference.

Generally, layer 28, that is X-ray transparent, is supported by two or more circular ring structures that are not shown. Layer 28, typically is made of materials, such as silicon, silicon nitride, silicon carbide, diamond, or the like. Plating base layer 24, usually X-ray opaque and made of a metal, such as chromium, is deposited on X-ray transparent layer 28 to a typical thickness of 0.01 micron. A photoactive material, such as photoresist, is put on plating base layer 24 and is exposed by a reduction projection means. It should be understood that the photoactive material may be either positive or negative acting in response to exposure. Typically, the photoactive material is chosen based on its sensitivity to radiation from radiation source 10, as well as depending on exposure technique that is used. Exposure results in a reduced pattern that originates from pattern 13 on reticle 12 shown in FIG. 1 being projected to photoactive material. The photoactive material is developed so that open areas of plating base layer 28 are exposed and islands of photoactive material are generated. The islands of photoactive material then act as plating masks. Plating base layer 24 and the islands of photoactive material are plated until a thick X-ray absorbing layer 25 is produced in between the islands of photoactive material. Typically, X-ray absorbing material 25 is made of metals, such as gold, tantalum, tungsten, or the like. The remaining photoactive material is removed, creating open areas of plating base layer 24 that are etched. Once the open areas are etched a relatively X-ray transparent region is created with X-ray absorbing material 25 on plating base layer 24.

By now it should be appreciated that there has been provided an improvement in the manner by which X-ray master masks 21 are made. The use of reduction projection lithography offers many advantages, such as ease of making X-ray masks 21, improved feature size or line width control, and improved pattern placement. A further advantage of using reduction projection is saving cost by faster production of X-ray master mask 21.

We claim:

1. A method for improving line width control of a projected feature for an X-ray mask comprising:

providing a reduction projection tool having a known reduction capability;

providing a reticle in which features have been placed on the reticle having a random error that ranges between 0.5 micron to 0.12 micron;

placing the reticle into the reduction projection tool with the known reduction capability;

providing an X-ray master mask blank including at least an X-ray transparent layer with a first surface, a plating base layer made of chromium covering the said first surface, and a photoactive material coating the plating base layer; and exposing selected portions of the photoactive material on the X-ray master mask blank with a pattern generated and projected from the features on the reticle reducing the random error of the projected features by the known reduction capability, thereby improving control of the line width of the exposed features on the photoactive material coating the plate base layer.

2. The method of claim 1 further comprising having the reduction projection tool being an optical reduction projection tool, using lithographic techniques.

3. A method for improving pattern placement of an X-ray mask comprising:

providing a reduction projection tool with a known reduction capability;

providing a reticle with features making up a pattern that are placed on the reticle having a random error that ranges from 0.05 micron to 0.12 micron;

placing the reticle into the reduction projection tool;

providing an X-ray master mask blank that includes at least an X-ray transparent material made of silicon, a plating base layer made of chromium, and coating the plating base layer with a photoactive layer;

positioning the X-ray master mask blank coated with a photoactive material in the reduction projection tool so that the photoactive material on the plating base layer on the X-ray master mask blank is ready for exposure;

exposing selected portions of the photoactive material on the X-ray master mask blank with a reduced pattern projected from the features on the reticle reducing the random error of the projected features by the known reduction capability of the projection tool, thereby improving the projected pattern placement of the projected features on the photoactive layer;

developing the projected features in the photoactive layer so that open areas of the plating base layer are exposed and islands of photoactive materials are formed on the plating base layer;

plating the open areas of the plating base layer with an X-ray absorbing material, thereby forming areas of X-ray absorbing material between the islands of photoactive material;

removing the photoactive material from the plating base layer, thereby leaving the plated areas of X-ray absorbing material on the plating base layer; and etching the plating base layer and exposing the X-ray transparent material between the X-ray absorbing material plated onto the plating base layer: thereby improving pattern placement on an X-ray master mask by the reduction capability of the projection tool.

4. The method of claim 3 further comprising having the reduction projection tool being an optical reduction projection tool.

5. The method of claim 3 further comprising having the reduction projection tool using phase shift technology.

6. The method of claim 3 further comprising using a positive photoresist for the photo active material.

7. The method of claim 3 further comprising using a negative photoresist for the photo active material.

* * * * *